(12) United States Patent
Yang et al.

(10) Patent No.: US 11,004,871 B2
(45) Date of Patent: May 11, 2021

(54) DISPLAY PANEL AND DISPLAY APPARATUS

(71) Applicant: Shanghai Tianma AM-OLED Co., Ltd., Shanghai (CN)

(72) Inventors: Shuai Yang, Shanghai (CN); Yue Li, Shanghai (CN); Xingyao Zhou, Shanghai (CN); Zhi Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 39 days.

(21) Appl. No.: 16/706,828

(22) Filed: Dec. 8, 2019

(65) Prior Publication Data
US 2020/0381458 A1    Dec. 3, 2020

(30) Foreign Application Priority Data

May 31, 2019   (CN) .......................... 201910473143.7

(51) Int. Cl.
H01L 27/12    (2006.01)
H01L 27/32    (2006.01)

(52) U.S. Cl.
CPC ........ *H01L 27/1222* (2013.01); *H01L 27/124* (2013.01); *H01L 27/3262* (2013.01)

(58) Field of Classification Search
CPC combination set(s) only.
See application file for complete search history.

(56) References Cited

FOREIGN PATENT DOCUMENTS

CN    206209225 U    5/2017

*Primary Examiner* — Mounir S Amer
(74) *Attorney, Agent, or Firm* — Kilpatrick Townsend & Stockton, LLP

(57) ABSTRACT

Disclosed are a display panel and a display apparatus. The display panel includes a multiplex circuit, a plurality of signal connection lines and a plurality of data signal lines, wherein each of the switch devices in the multiplex circuit comprises at least one thin film transistor; the colors of all pixel units in a first pixel unit column are the same; the colors of at least two pixel units in a second pixel unit column are different; first switch devices correspond to first pixel unit columns; second switch devices correspond to second pixel unit columns; and the equivalent channel width-to-length ratio of thin film transistors in each first switch device is less than the equivalent channel width-to-length ratio of thin film transistors in each second switch device.

20 Claims, 12 Drawing Sheets

DISPLAY PANEL AND DISPLAY APPARATUS

CROSS-REFERENCE TO RELATED APPLICATION

This application claims priority of Chinese Patent Application No. 201910473143.7, filed on May 31, 2019, which is hereby incorporated by reference in its entirety.

FIELD

The present disclosure relates to the field of display, and in particular, to a display panel and a display apparatus.

BACKGROUND

With users' increasing demands for displaying effects of displays, a display with a narrow bezel and a high screen-to-body ratio is becoming more and more popular. To reduce the width of the lower bezel of the display, a multiplex circuit is disposed in the non-display area of the lower bezel of the display. The multiplex circuit can control charging of different data signal lines and reduce the quantity of fanout wiring cables. Therefore, the bottom-bench space occupied by the fanout wiring cables can be reduced, to reduce the lower bezel of the display and achieve a higher screen-to-body ratio.

SUMMARY

Some embodiments of the present disclosure provide a display panel, including a multiplex circuit, a plurality of signal connection lines and a plurality of data signal lines, and the multiplex circuit comprises a plurality of input ends and a plurality of output ends, the input ends of the multiplex circuit are connected to the signal connection lines, and the output ends of the multiplex circuit are connected to the data signal lines;

the multiplex circuit comprises a plurality of switch devices, each of the switch devices comprises at least one thin film transistor, and each of the switch devices is electrically connected to a pixel unit column by a corresponding data signal line;
  the switch devices comprise a first switch device and a second switch device;
  the pixel unit column comprise a first pixel unit column and a second pixel unit column, colors of all pixel units in the first pixel unit column are same, and colors of at least two pixel units in the second pixel unit column are different;
  the first switch device is in one-to-one correspondence to the first pixel unit column, and the second switch device is in one-to-one correspondence to the second pixel unit column; and
  an equivalent channel width-to-length ratio of thin film transistors in the first switch device is less than an equivalent channel width-to-length ratio of thin film transistors in the second switch device, and the equivalent channel width-to-length ratio is a ratio of a total channel width of all thin film transistors in switch devices to a total channel length of all the thin film transistors in the switch devices.

Some embodiments of the present disclosure provide a display apparatus, including any one of the foregoing display panels.

DETAILED DESCRIPTION OF THE EMBODIMENTS

The display panel and the display apparatus provided by the embodiments of the present disclosure will be described below in conjunction with the accompanying drawings. The width and the shape of each component in the accompanying drawings do not reflect a substantial proportion of the display apparatus, and are merely used to indicate content of the present disclosure.

Figure 1:
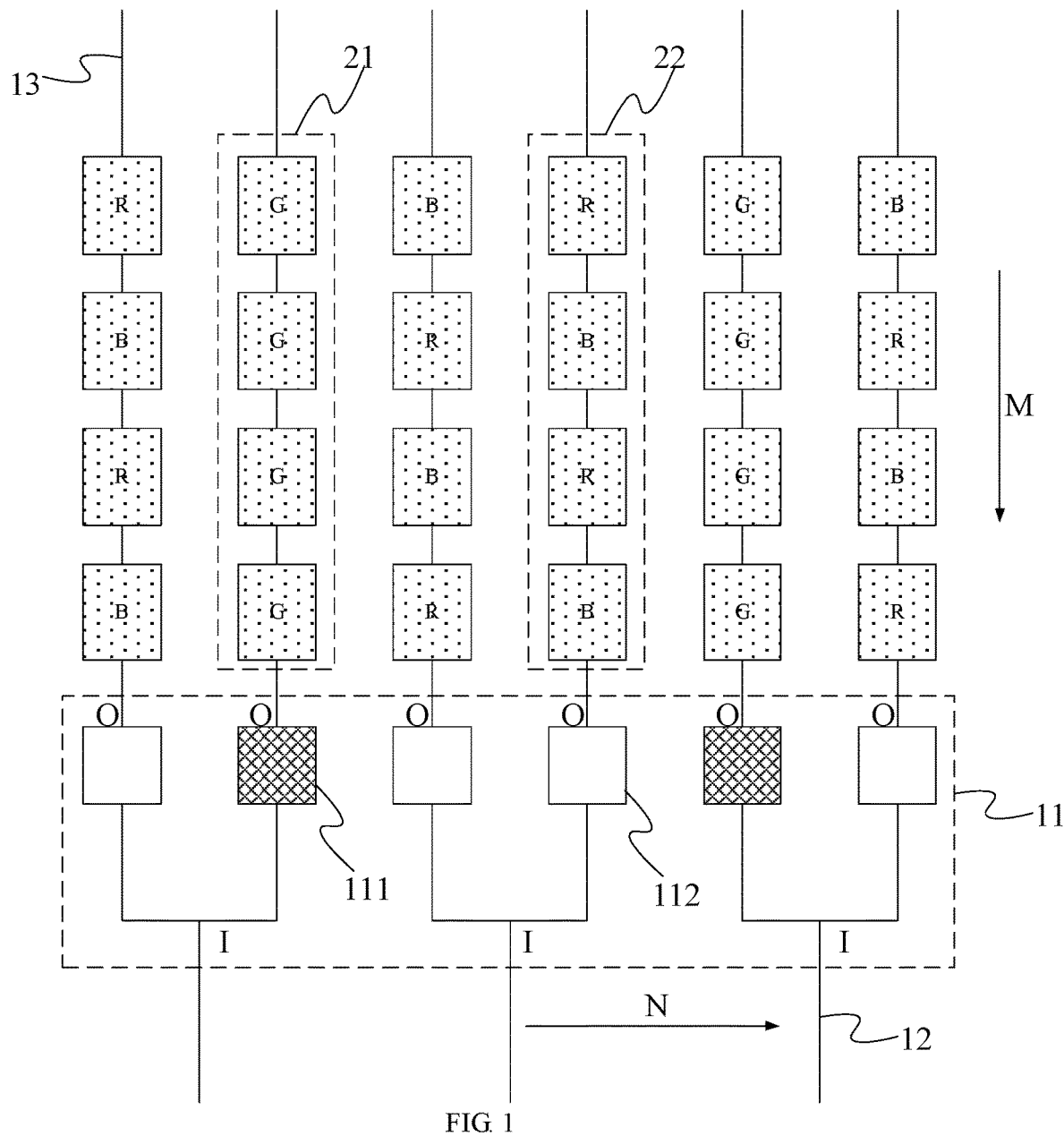
FIG. 1 is a first structural schematic diagram of a circuit of a display panel according to some embodiments of the present disclosure.

FIG. 1 is a structural schematic diagram of a circuit of a display panel according to some embodiments of the present disclosure. As shown in FIG. 1, the display panel provided by this embodiment of the present disclosure includes a multiplex circuit 11, a plurality of signal connection lines 12 and a plurality of data signal lines 13, and the multiplex circuit 11 includes a plurality of input ends I and a plurality of output ends O, the input ends I of the multiplex circuit are connected to the signal connection lines 12, and the output ends of the multiplex circuit are connected to the data signal lines 13. The multiplex circuit 11 further includes a clock control end that is not shown in the figure. Under the control of the clock control end, multi-channel gating can be implemented. A signal input from a signal connection line 12 is output to a gated data signal line 13, to charge the corresponding data signal line 13.

The multiplex circuit 11 provided by this embodiment of the present disclosure includes a plurality of switch devices, and each of the switch devices includes at least one thin film transistor, and each of the switch devices is electrically connected to a pixel unit column by a corresponding data signal line. As shown in FIG. 1, the switch devices include first switch devices 111 and second switch devices 112; the pixel unit columns include first pixel unit columns 21 and second pixel unit columns 22; the colors of all pixel units in each first pixel unit column 21 are the same, and the colors of at least two pixel units in each second pixel unit column 22 are different; and the first switch devices 111 are in one-to-one correspondence to the first pixel unit columns 21, and the second switch devices 112 are in one-to-one correspondence to the second pixel unit columns 22. All pixel unit columns are disposed in a display area of the display panel, and the multiplex circuit and the signal connection lines are disposed in a non-display area of the display panel. Data signal lines connected to the first switch devices 111 are connected to the first pixel unit columns in the display area, and data signal lines connected to the second switch devices 112 are connected to the second pixel unit columns in the display area.

When a switch device corresponding to a pixel unit column is controlled to be turned on, the pixel unit column can be charged. In addition, the colors of all the pixel units in each first pixel unit column 21 are the same, and the colors of at least two pixel units in each second pixel unit column 22 are different. Therefore, compared with the second pixel unit columns 22, the first pixel unit columns 21 respond to image signal switching at a slower speed. By taking a pixel arrangement structure shown in FIG. 1 as an example, each first pixel unit column 21 includes only green pixel units G, and each second pixel unit column 22 includes red pixel units R and blue pixel units B. When a 255-gray-scale white screen is displayed, a potential Vg255 needs to be applied to the green pixel units G, a potential Vr255 needs to be applied to the red pixel units R, and a potential Vb255 needs to be applied to the blue pixel units B. For each first pixel unit column 21, the first pixel unit column can be charged by keeping the potential Vg255 unchanged. However, for each second pixel unit column 22, the second pixel unit column 22 can be charged only by switching between the potential Vr255 and the potential Vb255.

Considering that the foregoing pixel unit arrangement structure has different requirements on signal switching response speeds, in this embodiment of the present disclosure, the equivalent channel width-to-length ratio of thin film transistors in each first switch device 111 is set to be less than the equivalent channel width-to-length ratio of thin film transistors in each second switch device 112. The equivalent channel width-to-length ratio is a ratio of the total channel width of all thin film transistors in each switch device to the total channel length of all the thin film transistors in the switch device. The total channel width of all thin film transistors in each switch device is a sum of channel widths of all thin film transistors in the switch device. This application provides a design of pixel arrangement, a design of a multiplexer for the foregoing pixel arrangement structure, and a particular design of a channel area parameter of thin film transistors in a switch device corresponding to a single-color pixel unit column, to reduce the equivalent channel width-to-length ratio of a switch device corresponding to at least one pixel unit column, and reducing the channel width of the switch device. After the channel width is reduced, a part of space can be saved for wiring, to achieve the effects of enlarging a wiring space and reducing the resistance of wired cables. In this way, the equivalent channel width-to-length ratio of each first switch device 111 having a low response-speed requirement is reduced, so that the space occupied by the multiplex circuit 11 is reduced, a larger wiring space is provided for wiring in a non-display area without affecting a speed of the display panel in responding to an image signal, the wiring area in the non-display area is enlarged, and the resistance is reduced.

Figure 2:
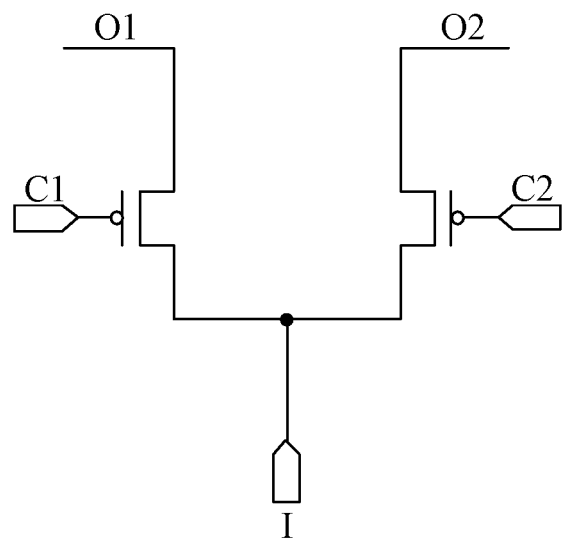
FIG. 2 is a principle diagram of a multiplex circuit according to some embodiments of the present disclosure.

A circuit principle of the multiplex circuit is shown in FIG. 2. FIG. 2 may be a structure of a multiplexer in the multiplex circuit. The multiplexer includes two switching tubes. The control electrodes of the two switching tubes are each connected to one clock control end, and the first electrodes of the two switching tubes are connected to the input ends I. When the first clock control end C1 controls a corresponding switching tube to be turned on, and the second clock control end C2 controls a corresponding switching tube to be turned off, signals of the input ends I may be transmitted to the output ends O1; or when the first clock control end C1 controls a corresponding switching tube to be turned off, and the second clock control end C2 controls a corresponding switching tube to be turned on, signals of the input ends I may be transmitted to the output ends O2. Therefore, selective turn-on of the multiplex circuit can be implemented. In one embodiment, the multiplexer in the multiplex circuit may further include three or more switching tubes, configured to control more-channel gating. A working principle is similar, and is not limited here. In practical application, any multiplexer whose an input end-to-output end ratio is 1:n may be selected as required, and n is an integer greater than or equal to 2. Details are not described herein.

Figure 3:
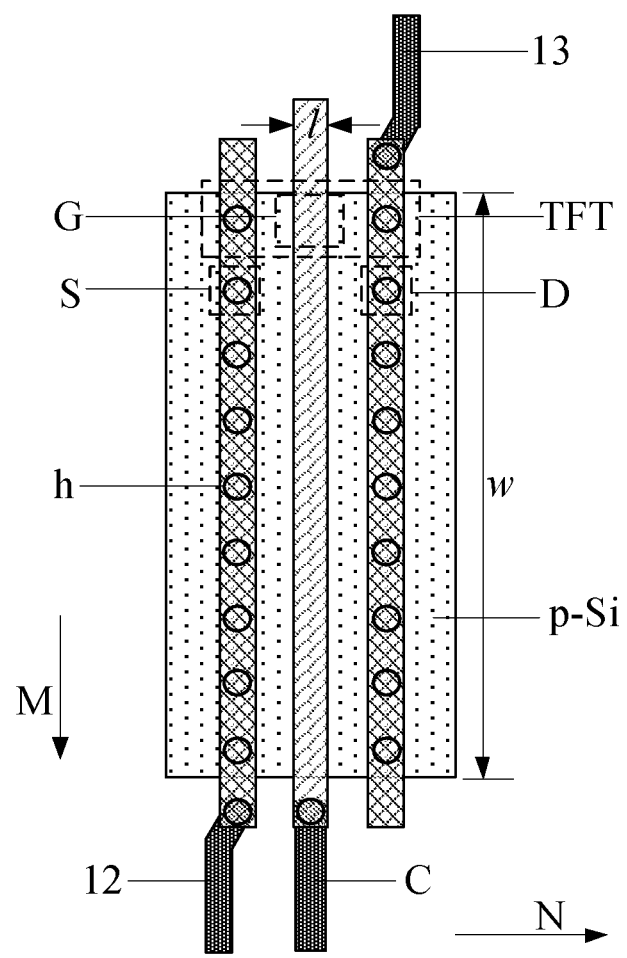
FIG. 3 is a first structural schematic diagram of a switch device according to some embodiments of the present disclosure.

To accelerate the response speed of a switch device, this embodiment of the present disclosure may use a connection manner of connecting a plurality of thin film transistors in parallel, to form the switch device. More than ten groups of thin film transistors are connected in parallel, to increase the equivalent channel width-to-length ratio of the switch device, and further achieve a relatively high response speed. A parallel structure of a plurality of thin film transistors is shown in FIG. 3. A parallel relationship among the thin film transistors TFT is that gates G of the plurality of thin film transistors are connected to the same clock signal end C, the first electrodes of the plurality of thin film transistors are connected to the same signal connection line 12, and the second electrodes of the plurality of thin film transistors are connected to the same data signal line 13; and the first electrode of each thin film transistor is a source S, and the second electrode of the thin film transistor is a drain D; or, the first electrode of each thin film transistor is a drain D, and the second electrode of the thin film transistor is a source S. As shown in FIG. 3, in a thin film transistor TFT shown in a dotted block, an area covered by the orthographic projection, on an active layer p-Si, of the gate G of the thin film transistor TFT is the channel area of the thin film transistor TFT; source-drain contact areas of the thin film transistor TFT are oppositely arranged on two sides of the channel area in the Nth direction; the orthographic projections, on the active layer p-Si, of the source S and the drain D of the thin film transistor TFT are respectively overlapped with the source-drain contact areas; and the source S is connected to a source contact area on the active layer by a via hole, and the drain D is connected to the source contact area on the active layer by a via hole. A plurality of thin film transistors in the same switch device are arranged sequentially in the Mth direction. It can be understood that the gates G of a plurality of thin film transistors in the same switch device are arranged adjacently in the Mth direction, to form a strip-shaped metal pattern extending in the Mth direction; the sources S of a plurality of thin film transistors in the same switch device are arranged adjacently in the Mth direction, to form a strip-shaped metal pattern extending in the Mth direction; and the drains D of a plurality of thin film transistors in the same switch device are arranged adjacently in the Mth direction, to form a strip-shaped metal pattern extending in the Mth direction. In FIG. 3, the length of the channel area is the width of the gates of the thin film transistors in a horizontal direction, and the width of the channel area is the length of the gates of the thin film transistors in a vertical direction. When the manner of connecting a plurality of thin film transistors in parallel is used, as shown in FIG. 3, the length 1 of the channel area is kept unchanged, while the width w of the channel area is increased. Therefore, the equivalent channel width-to-to-length ratio w/l of each switch device is increased. The response speed of the switch device can be greatly accelerated by using such a setting manner. In one embodiment, the gates of all thin film transistors in each switch device may be connected together, the first electrodes of all the thin film transistors may be connected together, and the second electrodes of all the thin film transistors may be connected together, thereby achieving a maximum channel width-to-length ratio. In practical application, the thin film transistors may be p-type thin film transistors, or may be n-type thin film transistors, and are not limited here.

In a production process, the active layer, the gate, the source and the drain of a thin film transistor, and a connected signal cable are generally disposed on different layers. A top gate thin film transistor is used as an example. First, an active layer needs to be disposed on a substrate; a gate pattern is disposed after a gate insulation layer is formed on the active layer; a source pattern and a drain pattern are formed after an inter-layer insulation layer is formed on the gate pattern, and the source and the drain are connected with the active layer through via holes. A production sequence of the thin film transistor in the switch device is similar to the foregoing process. The signal cable connected to the electrodes of the thin film transistor may be located above or below a connected component film layer, and the signal cable may be connected to corresponding component through a via hole.

As shown in FIG. 1, all the pixel units in the foregoing display panel provided by the embodiments of the present disclosure are arranged in an array. If the column direction of the pixel unit is parallel to the Mth direction, and the row direction of the pixel unit is parallel to the Nth direction, the multiplex circuit 11 is disposed in a non-display area on one side of a display area in the Mth direction, the Mth direction is parallel to the column direction of the pixel unit, all switch devices in the multiplex circuit 11 are arranged in the row direction of the pixel unit (the Nth direction), and all the data signal lines 13 and all the signal connection lines 12 extend in the column direction of the pixel unit (the Mth direction), and are arranged in the row direction of the pixel unit (the Nth direction). As shown in FIG. 3, all thin film transistors TFT in the same switch device are arranged in the data signal line extending direction (the Mth direction). In the Nth direction, the first electrode and the second electrode of each thin film transistor TFT are oppositely arranged on two sides of the gate of the thin film transistor; the first electrode of each thin film transistor is a source S, and the second electrode of the thin film transistor is a drain D; or, the first electrode of each thin film transistor is a drain D, and the second electrode of the thin film transistor is a source S. The multiplex circuit is disposed in a non-display area on one side of a display area, and the manner of connecting a plurality of thin film transistors in parallel needs to be used to increase the channel width-to-to-length ratio of each switch device in the multiplex circuit. Therefore, the multiplex circuit definitely occupies a space of a lower bezel of the display panel. In the foregoing arrangement direction, the thin film transistors can be arranged more compactly while the equivalent channel width-to-length ratio of the switch device is increased, and the space in the lower bezel is made full use of. Signal cables used to charge pixel unit columns in the display panel usually extend in the column direction of the pixel unit. The thin film transistors of each switch device are arranged in the column direction of the pixel unit, so that unnecessary intersection between components in the thin film transistors and the signal cables can be avoided, signal interference is avoided, and requirements on a production process are reduced.

Figure 4:
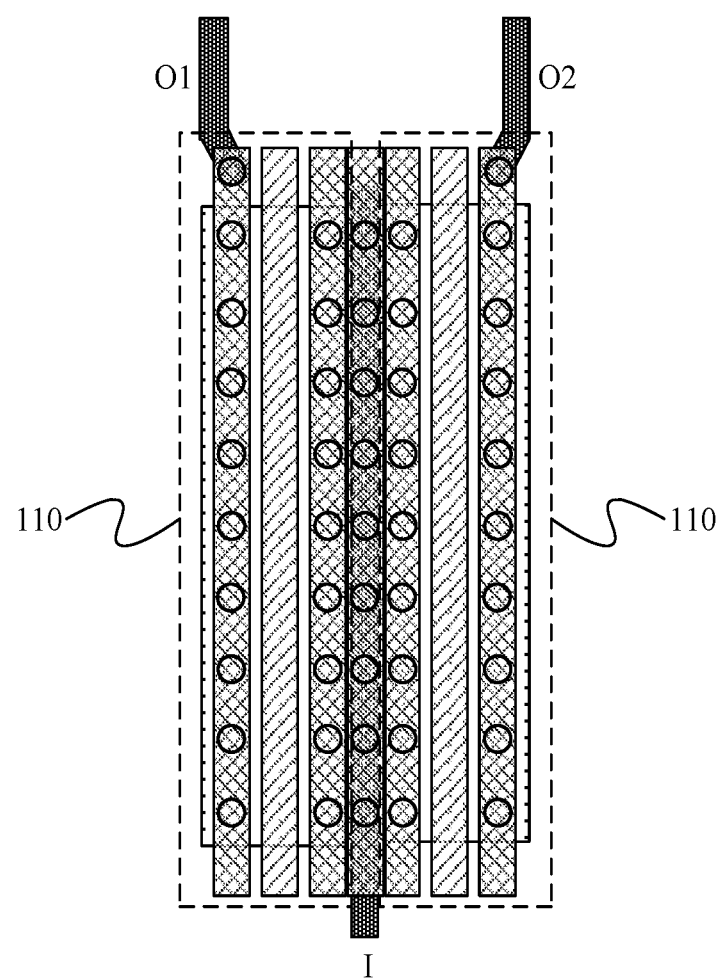
FIG. 4 is a structural schematic diagram of a multiplexer according to some embodiments of the present disclosure.

Currently, in a feasible design studied by the inventor, a switch device corresponding to a first pixel unit column and a switch device corresponding to a second pixel unit column adopt identical structures. Two switch devices 110 in FIG. 4 are used as examples. If the left-side switch device corresponds to the second pixel unit column, and the right-side switch device corresponds to the first pixel unit column, the switch devices 110 have identical structures instead of being differentiated due to different response speeds of pixel units.

Figure 5:
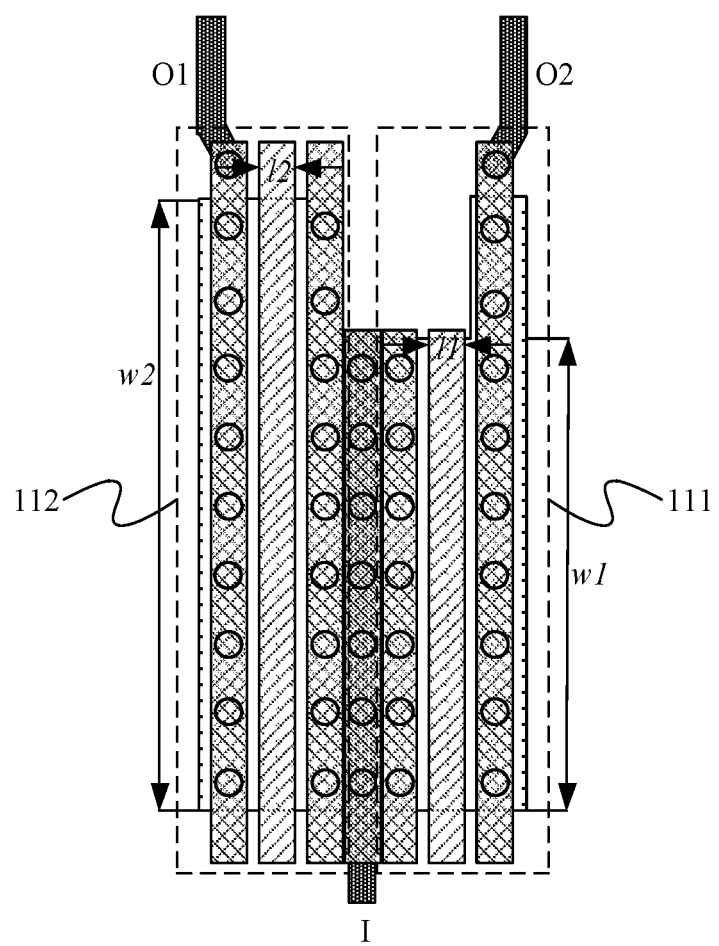
FIG. 5 is a first structural schematic diagram of a first switch device according to some embodiments of the present disclosure.

In this embodiment of the present disclosure, that the first pixel unit column has a relatively low signal switching response speed is taken into consideration. Therefore, the equivalent channel width-to-length ratio of a corresponding switch device can be properly reduced, to reduce a switch device-occupied space in a non-display area, and use the saved space for wiring of signal cables. In one embodiment, the equivalent channel width-to-length ratio of a first switch device 111 corresponding to a first pixel unit column may be less than the equivalent channel width-to-length ratio of a second switch device 112 corresponding to a second pixel unit column. Referring to the structural schematic diagram of the switch devices shown in FIG. 5, if the left-side switch device (112) corresponds to the second pixel unit column, and the right-side switch device (111) corresponds to the first pixel unit column, the width l1, in the row direction of the pixel unit, of an orthographic projection of the gates of all thin film transistors in the first switch device 111 on an active layer may be equal to the width l2, in the row direction of the pixel unit, of an orthographic projection of the gates of all thin film transistors in the second switch device 112 on the active layer; and the total length w1, in the column direction of the pixel unit, of an orthographic projection of the gates of all thin film transistors in the first switch device 111 on an active layer may be less than the total length w2, in the column direction of the pixel unit, of an orthographic projection of the gates of all thin film transistors in the second switch device on the active layer. Therefore, the equivalent channel width-to-length ratio w1/l1 of the first switch device 111 may be less than the equivalent channel width-to-length ratio w2/l2 of the second switch device 112, to enable the first switch device to properly slow down the signal switching response speed without affecting normal image display of the first pixel unit column. Therefore, a part of a space above the first switch device shown in FIG. 5 is saved for wiring of signal cables, which enlarges the area of the signal cables and reduces the resistance of the signal cables.

That the thin film transistors in the switch device need to be arranged in the foregoing structure is taken into consideration. Therefore, in the foregoing display panel provided by the embodiments of the present disclosure, the total channel length of the thin film transistors in the first switch device may be equal to the total channel length of the thin film transistors in the second switch device; and the total channel width of the thin film transistors in the first switch device may be less than the total channel width of the thin film transistors in the second switch device. Referring to the two switch device structures shown in FIG. 5, the total channel length of the thin film transistors in the first switch device 111 is l1, and the total channel length of the thin film transistors in the second switch device 112 is l2; and the total channel width of the thin film transistors in the first switch device 111 is w1, and the total channel width of the thin film transistors in the second switch device 112 is w2. When l1=l2, and w1<w2, w/l1<w2/l2, that is, the equivalent channel width-to-length ratio of the first switch device 111 is less than the equivalent channel width-to-length ratio of the second switch device 112. In this case, the objective of saving a space in a channel width direction can be achieved. In practical application, when the performance of the display panel is taken into consideration, on the premise that normal image display is not affected, the total channel width w1 of the thin film transistors in the first switch device 111 is less than the total channel width w2 of the thin film transistors in the second switch device 112 by 10% or less.

In one embodiment, some of the thin film transistors in the first switch device 111 may be removed to achieve the objective of reducing the equivalent channel width-to-length ratio of the first switch device 111. An arrangement structure is shown in FIG. 5. The quantity of the thin film transistors included in the first switch device 111 is less than the quantity of the thin film transistors included in the second switch device 112. In this arrangement manner, the channel length and width and the structure of each thin film transistor in the first switch device 111 and the second switch device 112 are the same as those in the structure herein. Therefore, it is unnecessary to design the size and structure of a particular thin film transistor in the production process, and the objective of reducing the equivalent channel width-to-length ratio can be achieved by removing some of the thin film transistors. Similarly, when the performance of the display panel is taken into consideration, on the premises that normal image display is not affected, the standard brightness uniformity of the display panel is enabled to be 95% or higher, and the charging degree of the data signal lines is enabled to be 90% or higher, the quantity of the thin film transistors included in the first switch device 111 may be less than the quantity of the thin film transistors included in the second switch device 112 by 10% or lower. The quantity of thin film transistors in the switch device that are connected to the data signal lines are reduced, so that an RC latency caused by the thin film transistors may be further reduced.

Figure 6:
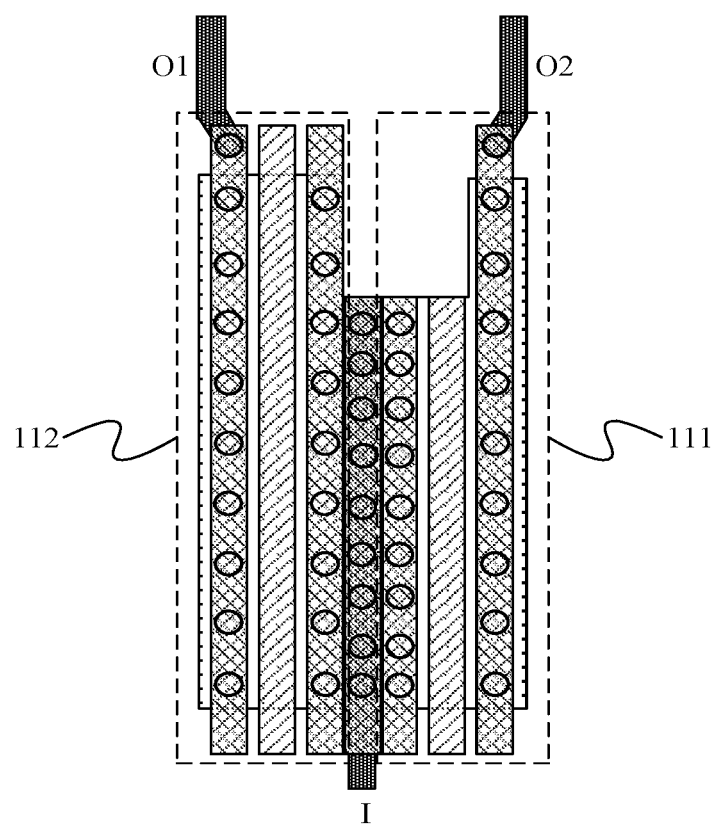
FIG. 6 is a second structural schematic diagram of a first switch device according to some embodiments of the present disclosure.

In another possible implementation, the objective of reducing the equivalent channel width-to-length ratio may be achieved without reducing the quantity of thin film transistors. For a specific structure, refer to FIG. 6. The quantity of the thin film transistors included in the first switch device 111 is equal to the quantity of the thin film transistors included in the second switch device 112. The channel width of at least some of the thin film transistors in the first switch device 111 is reduced, to achieve the objective of reducing the equivalent channel width-to-length ratio of the first switch device. In practical application, the channel widths of all the thin film transistors in the first switch device may be the same, and the channel width of each of the thin film transistors is less than the channel width of each of the thin film transistors in the second switch device. In this arrangement manner, the space occupied by the first switch device 11 can also be reduced for wiring of other signal cables.

Figure 7:
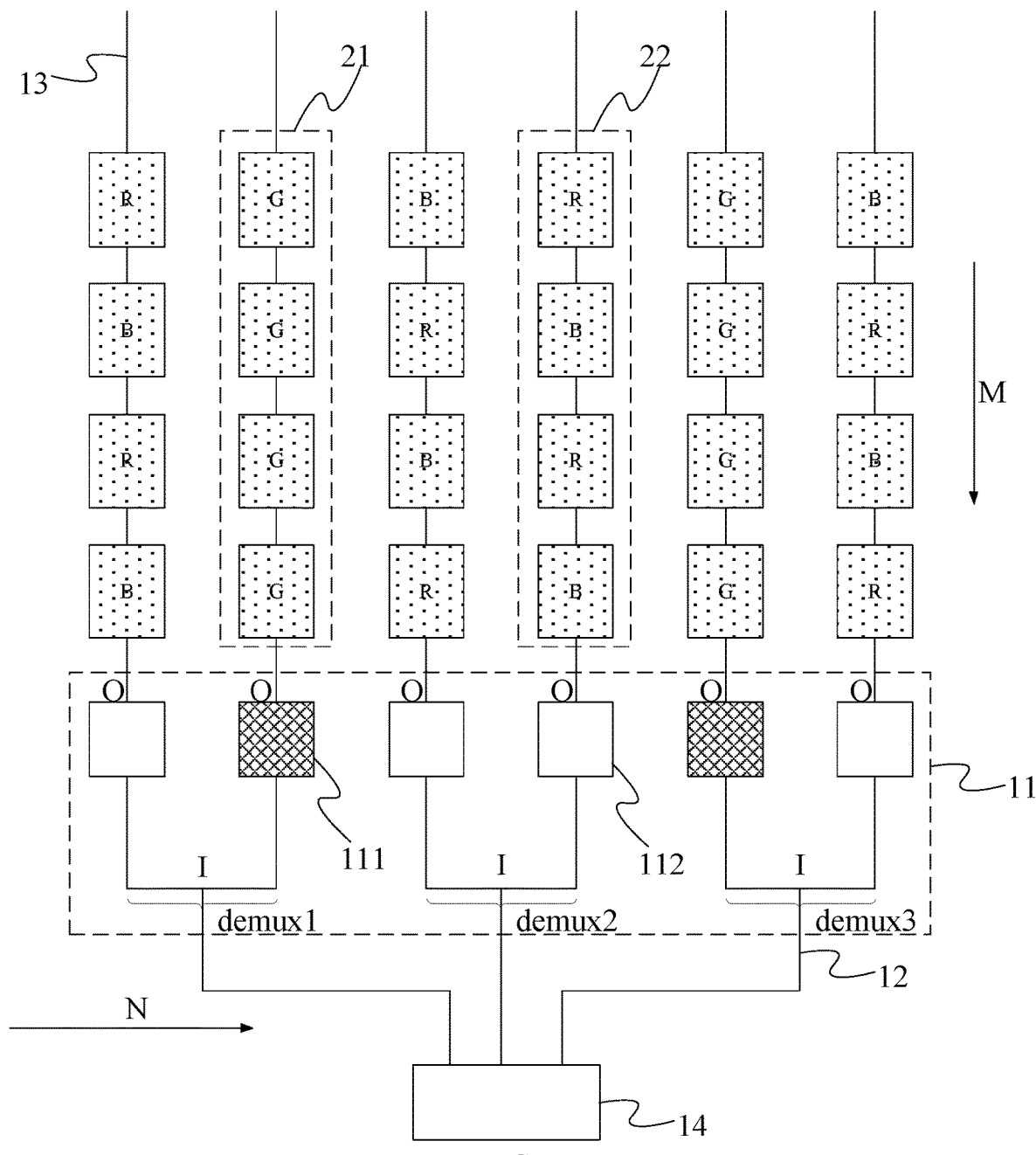
FIG. 7 is a second structural schematic diagram of a circuit of a display panel according to some embodiments of the present disclosure.

The usage quantity of signal connection lines can be reduced by using a multiplex circuit to control signal transmission of data signal lines, to reduce the space occupied by fanout wiring cables. FIG. 7 is a structural schematic diagram of a circuit of a display panel according to some embodiments of the present disclosure. The quantity of signal connection lines 12 is less than the quantity of data signal lines 13; and at least two switch devices, connected to different data signal lines, in the multiplex circuit 11 are connected to the same signal connection line. The display panel further includes a drive chip 14 connected to all the signal connection lines. The drive chip 14 is configured to output a data signal for controlling the display brightness of the pixel units to the multiplex circuit. The multiplexer can implement single-channel gating under the sequential control of a clock control signal, to charge a corresponding pixel unit column on a gated data signal line. When at least two switch devices, connected to different data signal lines, in the multiplex circuit 11 are connected to the same signal connection line, each switch device is controlled by using one clock control signal. When the on sequence of all switch devices connected to the same signal connection line is adjusted, the objective of transmitting data signals for a plurality of data signal lines by using one signal connection line can be achieved.

In one embodiment, two adjacent switch devices may be used to form one multiplexer, and each multiplexer is configured to control charging of two pixel unit columns. At least one signal cable may be arranged between adjacent multiplexers, so that a larger space can be reserved at a position adjacent to the first switch device for wiring of signal cables. Therefore, the wiring area of the signal cables is enlarged, the resistance of the signal cables is reduced, and the voltage drop of the signal cables is relieved.

That two switch devices form one multiplexer is used as an example below, to describe various arrangement structures of the multiplex circuit in detail. The following structures of the multiplex circuit are merely examples for description. In practical application, there may be other variations and adjustments according to requirements, which are not limited here.

As shown in FIG. 7, the pixel units in the display panel provided by this embodiment of the present disclosure include red pixel units R, green pixel units G and blue pixel units B. Each first pixel unit column 21 includes only the green pixel units G, and the second pixel unit column 22 includes the red pixel units R and the blue pixel units B that are alternately arranged in the column direction of the pixel unit. Two adjacent first pixel unit columns 21 are spaced by two second pixel unit columns 22, and the colors of two pixel units that are adjacent to each other in a row direction and that are in two adjacent second pixel unit columns 22 are different. The foregoing pixel arrangement manner may use the sub pixel rendering (SPR) technology to improve the PPI of the display panel and reduce the power consumption of the display panel. During charging, a first pixel unit column composed of the green pixel units G does not need to be switched to a potential of the second pixel unit column composed of the red pixel units R and blue pixel units B. Therefore, the equivalent channel width-to-length ratio of a switch device corresponding to the green pixel unit column may be reduced to achieve the objectives of pressure difference equalization and space reduction.

In this embodiment of the present disclosure, two switch devices corresponding to every two adjacent pixel unit columns in the display panel are connected to different data signal lines and the same signal connection line. In other words, two adjacent switch devices form one multiplexer, configured to control data signals of the two adjacent pixel unit columns. The display panel shown in FIG. 7 may include three multiplexers. The multiplexers (demux1 and demux2) respectively correspond to one first pixel unit column 21 and one second pixel unit column 22; and the multiplexer (demux3) corresponds to two second pixel unit columns 22. In a specific implementation process, a multiplexer may further include three or more switch devices, configured to control signals of three or more pixel unit columns. An implementation principle of the multiplexer is the same as that in the foregoing description, and is not limited here.

Figure 8:
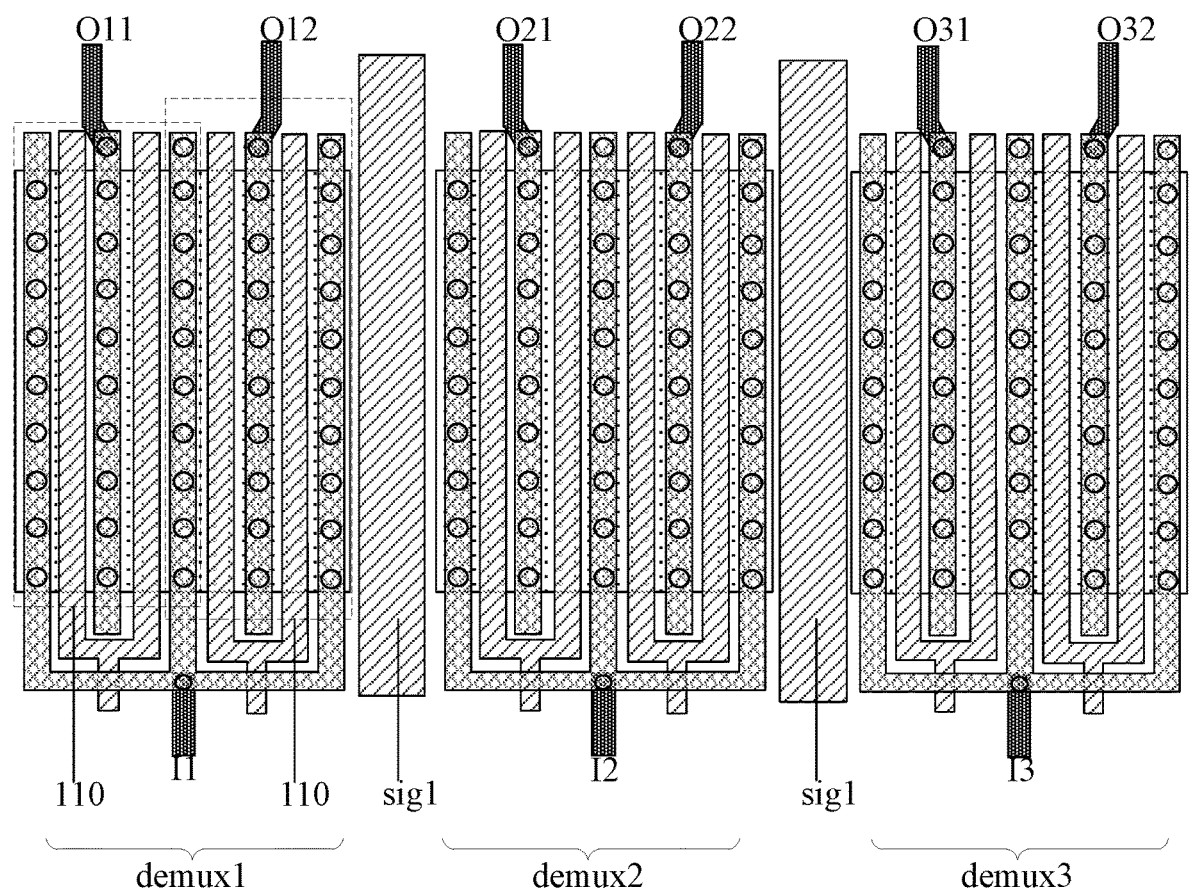
FIG. 8 is a first structural schematic diagram of a feasible multiplex circuit according to some embodiments of the present disclosure.

In a feasible design of the inventor in a research process, the structure of a multiplex circuit disposed for the display panel of the foregoing pixel arrangement structure is shown in FIG. 8. A first multiplexer demux1 (whose input end is I1 and whose output end is O11/O12), a second multiplexer demux2 (whose input end is I2 and whose output end is O21/O22), and a third multiplexer demux3 (whose input end is I3 and whose output end is O31/O32) are disposed from left to right sequentially in a horizontal direction. The output end O12 of the first multiplexer demux and the output end O31 of the third multiplexer demux3 correspond to one first pixel unit column, and the other output ends correspond to one second pixel unit column. Each multiplexer includes two switch devices 110 whose structures are the same. Therefore, regardless of whether the switch devices are switch devices corresponding to the first pixel unit column or switch devices corresponding to the second pixel unit column, the size and performance of the switch devices are consistent.

Figure 9:
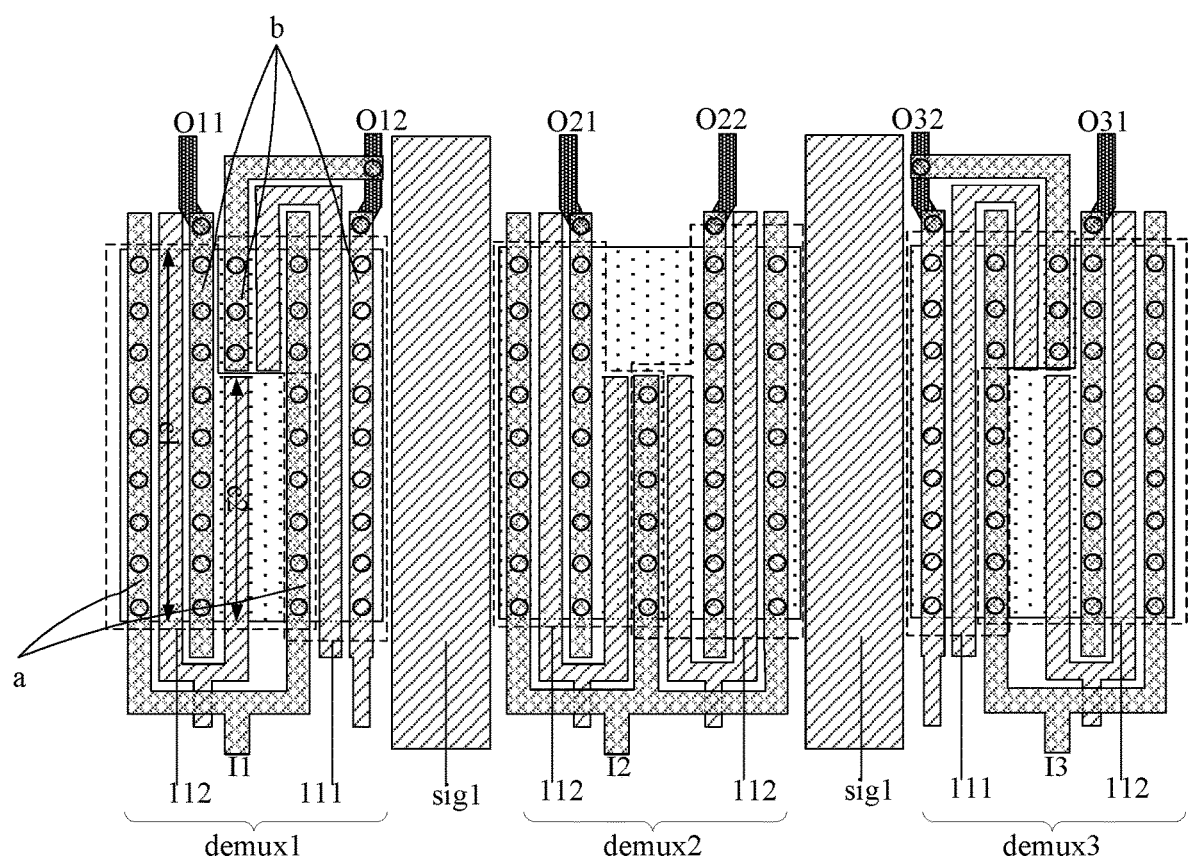
FIG. 9 is a first structural schematic diagram of a multiplex circuit according to some embodiments of the present disclosure.

However, for the first pixel unit column including only pixel units of the same color, the response speed of a switch device corresponding to the first pixel unit column can be properly lowered down to reduce the space occupied by the first pixel unit column. Therefore, the structure of the multiplex circuit can be improved in this embodiment of the disclosure. In one embodiment, FIG. 9 shows a structural schematic diagram of a multiplex circuit according to some embodiments of the present disclosure. A first switch device 111 and a second switch device 112 that are connected to the same signal connection line form one multiplexer, namely, a first multiplexer demux1 and a third multiplexer demux3 shown in FIG. 9. The structures of the first multiplexer demux1 and the third multiplexer demux3 are different from the structure of a second multiplexer demux2 adjacent to the first multiplexer demux1 and the third multiplexer demux3, a channel area of the switch device includes a first part c1 and a second part c2 that extend in the column direction of the pixel unit. The length of the first part c1 in the column direction of the pixel unit is greater than the length of the second part c2 in the column direction of the pixel unit. The foregoing lengths of the first part and the second part are a total length of a plurality of channel areas in the arrangement direction of a plurality of thin film transistors. Two second parts in the same multiplexer are not overlapped in the row direction of the pixel unit. The length, in the column direction of the pixel unit, of the second part of the first switch device 111 is less than the length, in the column direction of the pixel unit, of the second part of the 35 second switch device 112. Two second parts c2 in a multiplexer are disposed between two first parts c1 in the multiplexer.

The first part and the second part of the first switch device 111 share a first electrode a; the first part and the second part of the second switch device 112 share a second electrode b; the second part of the first switch device 111 and the second part of the second switch device 112 share the first electrode a. The first electrode of the thin film transistor is a source, and the second electrode of the thin film transistor is a drain; or, the first electrode of the thin film transistor is a drain, and the second electrode of the thin film transistor is a source.

The first multiplexer demux1 and the third multiplexer demux3 in FIG. 9 each include a first switch device 111 and a second switch device 112, while the second multiplexer demux2 includes two second switch devices 112. A channel area of the switch device is divided into two areas being different in length. Due to reasonable spatial optimization, a gap between the first switch device 111 and the second switch device 112 is reduced, and the channel width of the first switch device 111 is less than the channel width of the second switch device 112. Therefore, the widths of the first multiplexer demux1 and the third multiplexer demux3 in a horizontal direction in FIG. 9 can be reduced. It can also be learned from FIG. 9 that the width of the first multiplexer demux1/third multiplexer demux3 in the horizontal direction is less than the width of the second multiplexer demux2 in the horizontal direction. Therefore, the distance between the multiplexers is enlarged, and there may be a larger wiring space for a signal cable between the multiplexers.

In one embodiment, as shown in FIG. 8 and FIG. 9, the display panel generally further includes first signal lines sig1 extending in the row direction of the pixel unit. The first signal lines sig1 are disposed between adjacent multiplexers. The first signal lines sig1 may be connected to a drive chip, to transmit various signals. In one embodiment, in an organic light emitting diode display panel, first signal lines may be connected to a constant potential PVDD. The constant potential PVDD may be a signal for controlling a light emitting diode driving current. In a pixel circuit of the light emitting diode display panel, the first signal lines are electrically connected to an anode of a light emitting diode. It can be learned from a comparison between the structure of the multiplex circuit shown in FIG. 8 and the structure of the multiplex circuit provided by this embodiment of the present disclosure in FIG. 9, after the equivalent channel width-to-length ratio of the switch device is reduced, the width of the multiplexer including the first switch device may be reduced through reasonable adjustment of positions of the first switch device and the second switch device, so that the distance between the multiplexers is enlarged, the cable width of the first signal lines sig1 can be increased more conveniently, the resistance of the first signal lines is reduced, and the objectives of voltage drop reduction and parasitic capacitance reduction of the first signal lines are achieved.

Figure 10:
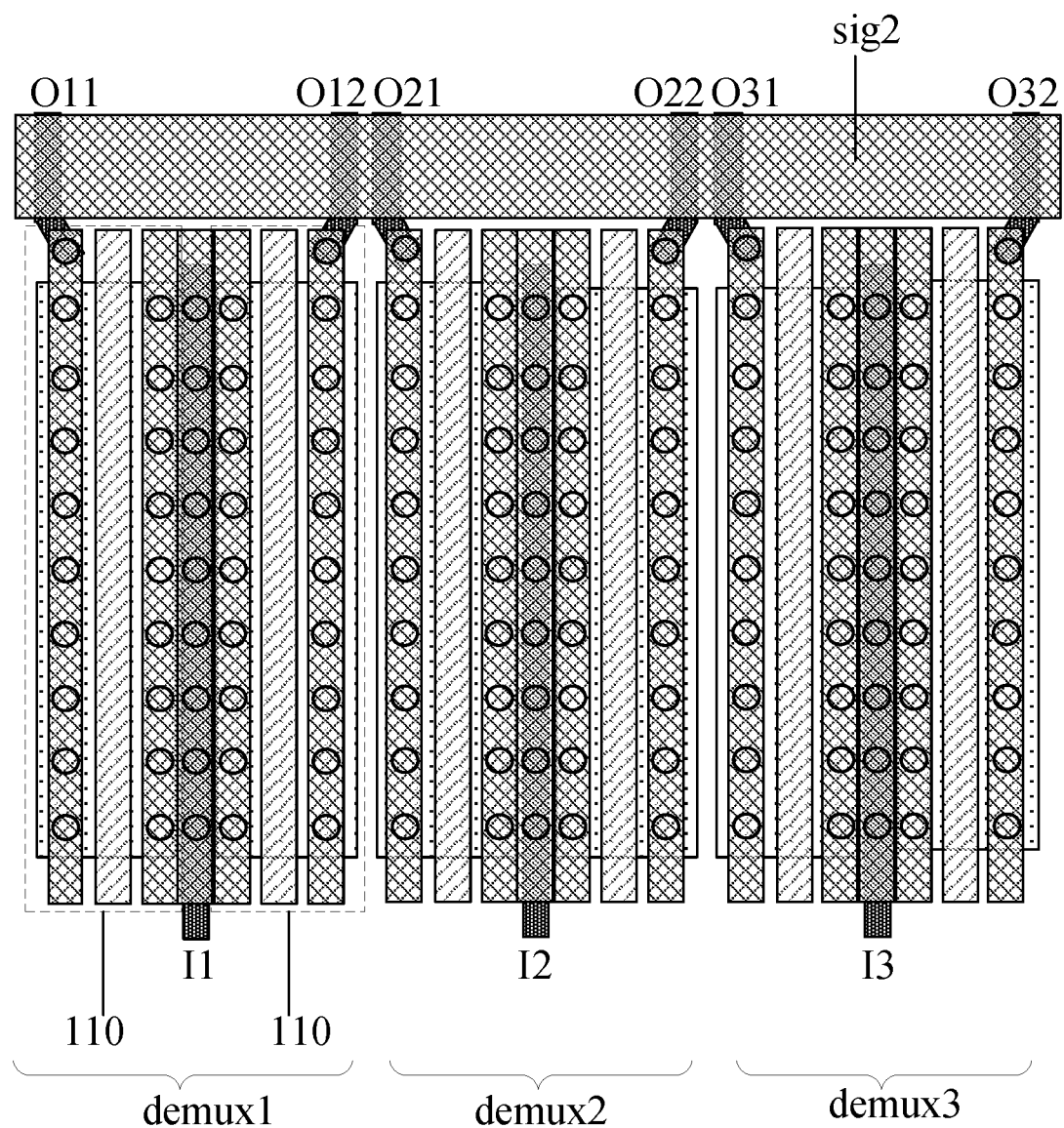
FIG. 10 is a second structural schematic diagram of a feasible multiplex circuit according to some embodiments of the present disclosure.

In another possible implementation, in a feasible design of the inventor in a research process, the multiplex circuit may use the structure shown in FIG. 10. A first multiplexer demux1 (whose input end is I1 and whose output end is O11/O12), a second multiplexer demux2 (whose input end is I2 and whose output end is O21/O22), and a third multiplexer demux3 (whose input end is I3 and whose output end is O31/O32) are disposed from left to right sequentially in a horizontal direction. The output end O12 of the first multiplexer demux and the output end O31 of the third multiplexer demux3 correspond to one first pixel unit column, and the other output ends correspond to one second pixel unit column. Each multiplexer includes two switch devices 110 whose structures are the same. Therefore, regardless of whether the switch devices are switch devices corresponding to the first pixel unit column or switch devices corresponding to the second pixel unit column, the size and performance of the switch devices are consistent.

In this embodiment of the present disclosure, the structure of the multiplex circuit may be adjusted to the structure shown in FIG. 11 in the following manner: the channel width of two first switch devices 111 corresponding to two first pixel unit columns is properly reduced; a quantity of thin film transistors are removed from the first switch devices 111; and the side (the bottom in FIG. 11), connected to the signal connection line, of each switch device is aligned with the side, connected to the signal connection line, of another switch device, so that the first switch device 111 is shorter than the second switch device 112 on the side (the top in FIG. 11) far away from the signal connection line. In an area in which the entire multiplexer is located, a part of an edge on the side, far away from the signal connection line, of the area is concave inwards to form a notch. Then, wiring may be enhanced at the position of the notch for signal cables adjacent to the notch, to reduce the resistance of the signal cables.

Figure 11:
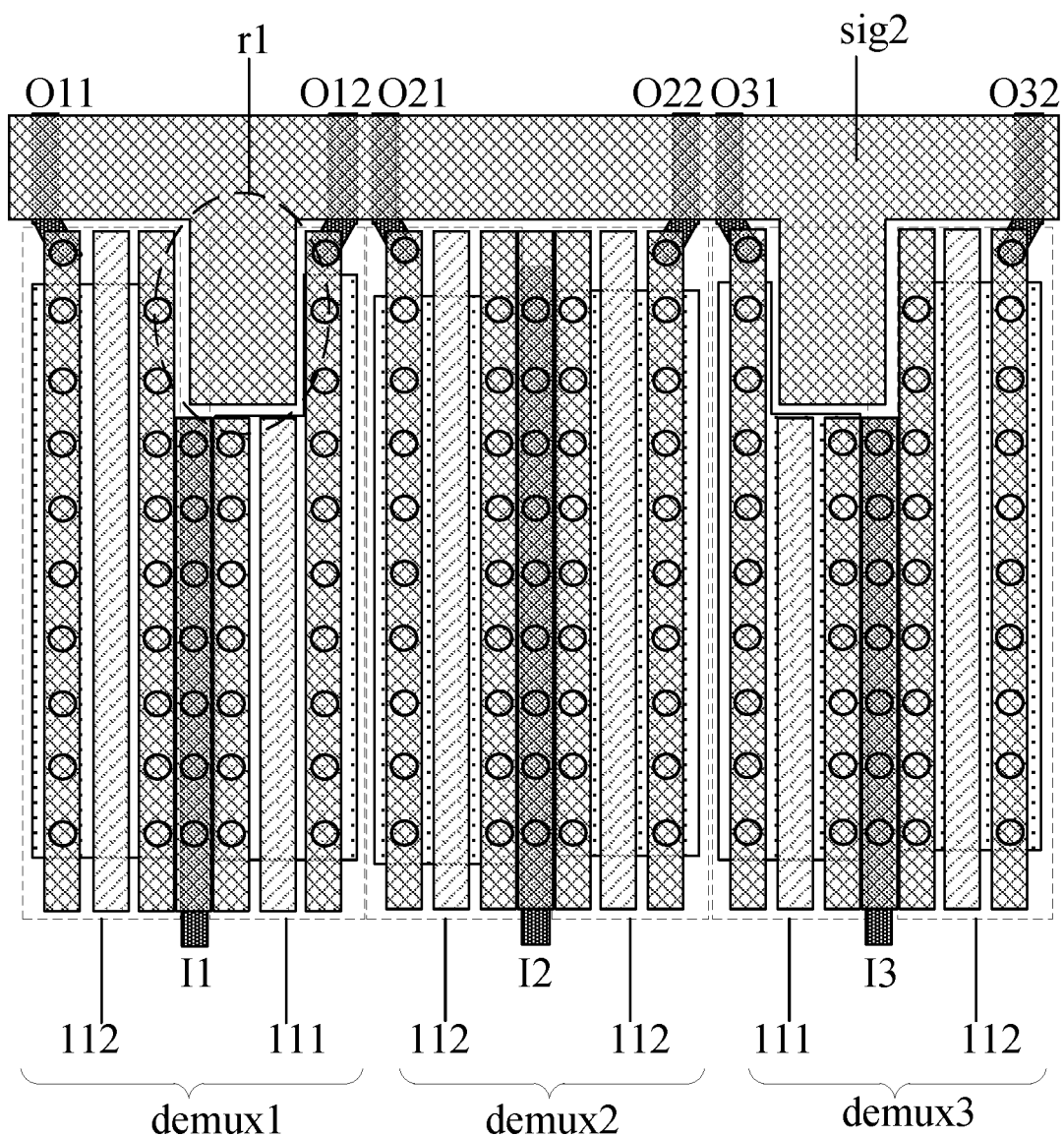
FIG. 11 is a second structural schematic diagram of a multiplex circuit according to some embodiments of the present disclosure.

In one embodiment, as shown in FIG. 10 and FIG. 11, the display panel generally further includes second signal lines sig2 that extend in the row direction of the pixel unit and that are disposed in the side, far away from the drive chip, of the multiplex circuit. The second signal lines sig2 may be switch controlling signal cables SW used in detection of the panel, or may be other signal cables that are disposed in a non-display area and that extend in the row direction of the pixel unit, and are not limited here. It can be learned from a comparison between the structure of the multiplex circuit shown in FIG. 10 and the structure of the multiplex circuit provided by this embodiment of the present disclosure in FIG. 11, after the equivalent channel width-to-length ratio of the switch device is reduced, a space occupied by the first switch device 111 in the column direction of the pixel unit is less than a space occupied by the second switch device 112 in the column direction of the pixel unit. Therefore, when the first switch device 111 and the second switch device 112 are aligned with each other in the input-end sides (the sides close to the drive chip), an edge at the top of the multiplexer is concave inwards to form a notch. A first extended area r1 is arranged at a position, corresponding to the notch, of the second signal line sig2. The first extended area r1 is embedded in the notch. Therefore, the wiring area of the second signal lines sig2 is enlarged, the resistance of the second signal lines is reduced, and the objectives of voltage drop reduction and parasitic capacitance reduction of the second signal lines are reduced.

In another possible implementation, the structure of the multiplex circuit may be adjusted to the structure shown in FIG. 12 in the following manner: the channel width, at the position of the notch, of two first switch devices 111 corresponding to two first pixel unit columns is properly reduced; a quantity of thin film transistors are removed from the first switch devices; and the side, connected to the signal connection line, of each switch device is aligned with the side, connected to the signal connection line, of another switch device, so that the first switch device is shorter than the second switch device on the side far away from the signal connection line. In an area in which the entire multiplexer is located, a notch is formed in a corner on the side, far away from the drive chip, of the area. Then, a wiring area can be enlarged at the position of the notch for signal cables adjacent to the notch, to reduce the resistance of the signal cables.

Figure 12:
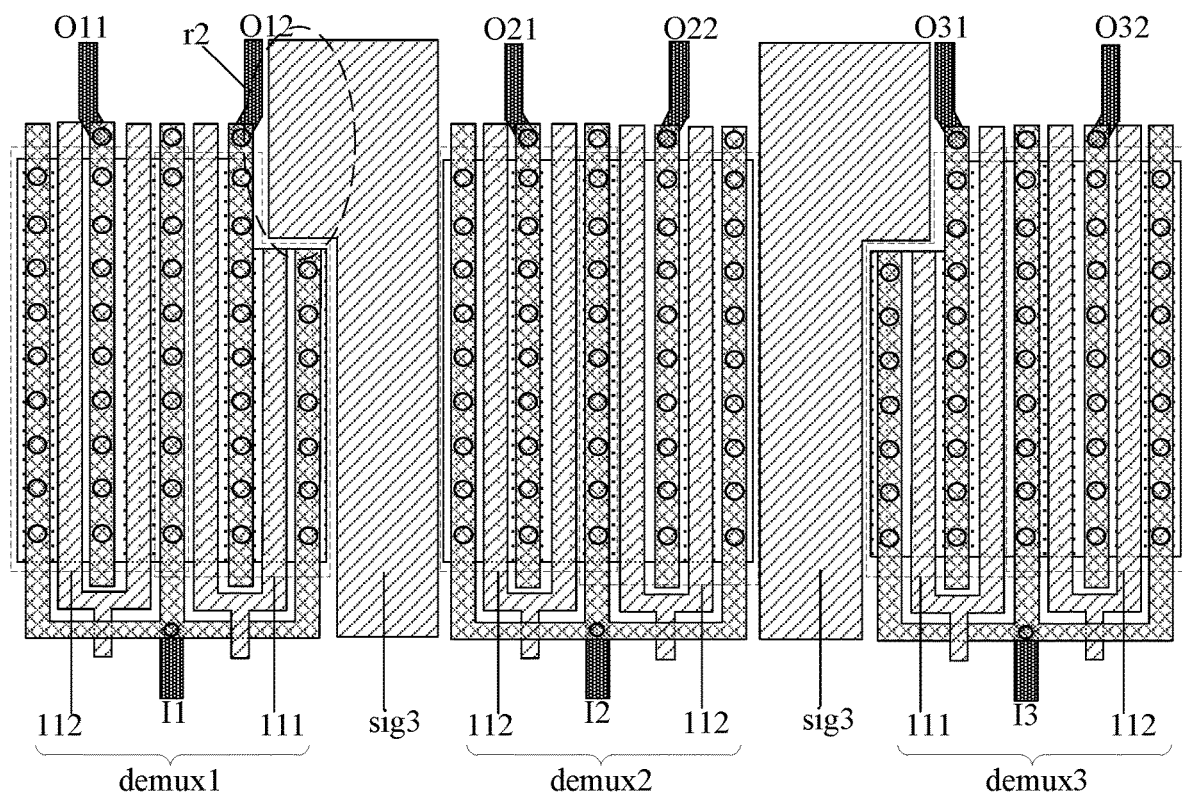
FIG. 12 is a third structural schematic diagram of a multiplex circuit according to some embodiments of the present disclosure.

In one embodiment, as shown in FIG. 12, the display panel generally further includes third signal lines sig3 extending in pixel unit column. The third signal line sig3 includes a second extended area r2 at a position corresponding to the notch. The second extended area r2 is embedded in the notch. Compared with the structure of the multiplex circuit shown in FIG. 8, the signal cables disposed between the multiplexers may enlarge a wiring area in the position of the notch formed in the first switch device 111, to reduce the resistance of the signal cables, and achieving the objectives of voltage drop reduction and parasitic capacitance reduction of the first signal lines.

The foregoing third signal lines sig3 are positioned between adjacent multiplexers. The third signal lines sig3 may be connected to the drive chip, to transmit multiple kinds of signals. In one embodiment, in an organic light emitting diode display panel, first signal lines may be connected to a constant potential PVDD. The constant potential PVDD may be a signal for controlling a light emitting diode driving current. In a pixel circuit of the light emitting diode display panel, the first signal lines are electrically connected to an anode of a light emitting diode. When being used as constant potential signal cables, the third signal lines sig3 may be disposed between multiplexers without causing crosstalk to signal transmission of the thin film transistors in the multiplexers. In addition, the third signal lines sig3 may be other signal cables that are disposed in the organic light emitting diode display panel and that extend in the column direction of the pixel unit, or may be signal cables that are in a liquid crystal display panel and that extend in the column direction of the pixel unit, and are not limited here.

According to the foregoing display panel provided by this embodiment of the present disclosure, the direction of the notch in the area where the multiplex circuit is located may be set based on signal cables whose wiring spaces need to be enlarged. In one embodiment, to increase the wiring of signal cables that are disposed on the side, near the display area, of the multiplexing circuit and that extend in the row direction of the pixel unit, the structure of the multiplex circuit shown in FIG. 11 can be used; or to increase the wiring of signal cables that are disposed between multiplexers in the multiplex circuits and that extend in the column direction of the pixel unit, the structure of the multiplex circuit shown in FIG. 9 and FIG. 12 can be used. In practical application, there may be other variations and adjustments according to specific requirements and the space in a lower border, which is not limited here.

Figure 13:
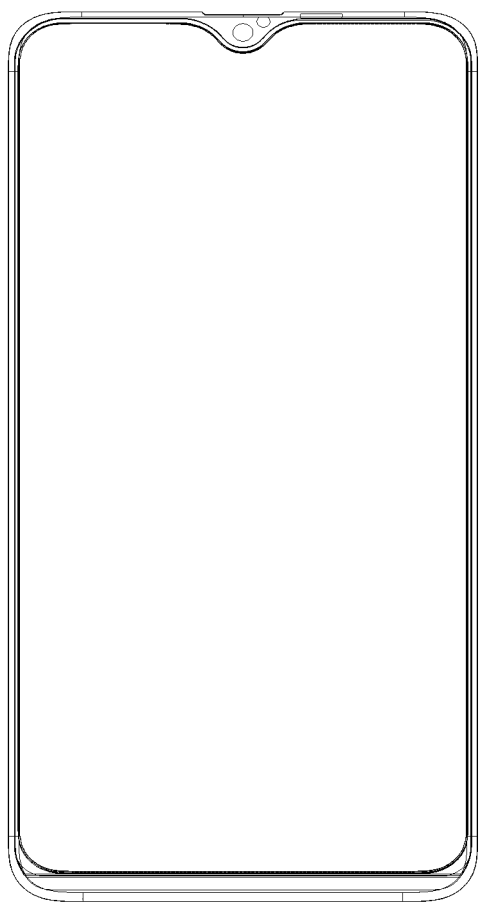
FIG. 13 is a top structural schematic diagram (top view) of a display apparatus according to some embodiments of the present disclosure.

Based on the same inventive concept, some embodiments of the present disclosure further provide a display apparatus. A top view of the display apparatus is shown in FIG. 13. The display apparatus includes any one of the foregoing display panels. The display apparatus may be a liquid crystal display panel, a liquid crystal display, a liquid crystal display TV, an organic light emitting diode display panel, an organic light emitting diode display, an organic light-emitting diode TV and other display devices, or may be mobile terminal devices such as a mobile phone, a tablet computer, or an electronic photo album, and is not limited here. The problem-resolving principle of the display apparatus is similar to that of the foregoing display panel. Therefore, for implementation of the display apparatus, refer to the foregoing display panel implementation. Repeated parts are not described again.

According to the display panel and the display apparatus provided by the embodiments of the present disclosure, the display panel includes a multiplex circuit, a plurality of signal connection lines and a plurality of data signal lines; the multiplex circuit includes a plurality of input ends and a plurality of output ends, the input ends of the multiplex circuit are connected to the signal connection lines, and the output ends of the multiplex circuit are connected to the data signal lines; the multiplex circuit includes a plurality of switch devices, each of the switch devices includes at least one thin film transistor, and each of the switch devices is electrically connected to a pixel unit column by a corresponding data signal line; the switch devices include first switch devices and second switch devices; the pixel unit columns include first pixel unit columns and second pixel unit columns, the colors of all pixel units in each first pixel unit column are the same, and the colors of at least two pixel units in each second pixel unit column are different; the first switch devices are in one-to-one correspondence to the first pixel unit columns, and the second switch devices are in one-to-one correspondence to the second pixel unit columns; and the equivalent channel width-to-length ratio of thin film transistors in each first switch device is less than the equivalent channel width-to-length ratio of thin film transistors in each second switch device, and the equivalent channel width-to-length ratio is a ratio of the total channel width of all thin film transistors in each switch device to the total channel length of all the thin film transistors in the switch device, to enable the first switch device to properly slow down the signal switching response speed without affecting normal image display of the first pixel unit column, and to reduce the equivalent channel width-to-length ratio of the first switch device. Therefore, the space occupied by the first switch device can be reduced, and the saved space can be used for wiring of adjacent signal cables, which enlarges the area of the signal cables and reduces the resistance of the signal cables.

What is claimed is:

1. A display panel, comprising:
a multiplex circuit, a plurality of signal connection lines and a plurality of data signal lines, wherein the multiplex circuit comprises a plurality of input ends and a plurality of output ends, the plurality of input ends of the multiplex circuit are connected to signal connection lines, and the plurality of output ends of the multiplex circuit are connected to data signal lines;
the multiplex circuit comprises a plurality of switch devices, each of the switch devices comprises at least one thin film transistor, and each of the switch devices is electrically connected to a pixel unit column by a corresponding data signal line;
the switch devices comprise a first switch device and a second switch device;
the pixel unit column comprise a first pixel unit column and a second pixel unit column, colors of all pixel units in the first pixel unit column are same, and colors of at least two pixel units in the second pixel unit column are different;
the first switch device is in one-to-one correspondence to the first pixel unit column, and the second switch device is in one-to-one correspondence to the second pixel unit column; and
an equivalent channel width-to-length ratio of thin film transistors in the first switch device is less than an equivalent channel width-to-length ratio of thin film transistors in the second switch device, and the equivalent channel width-to-length ratio is a ratio of a total channel width of the thin film transistors in switch devices to a total channel length of the thin film transistors in the switch devices.

2. The display panel according to claim 1, wherein each of the switch devices comprises a plurality of thin film transistors; and in a same switch device, gates of the plurality of thin film transistors are connected to a same clock signal end, first electrodes of the plurality of thin film transistors are connected to a same signal connection line, and second electrodes of the plurality of thin film transistors are connected to a same data signal line; and
a first electrode of each of the thin film transistors is a source, and a second electrode of each of the thin film transistors is a drain; or, a first electrode of each of the thin film transistors is a drain, and a second electrode of each of the thin film transistors is a source.

3. The display panel according to claim 2, wherein a total channel length of the thin film transistors in the first switch device is identical to a total channel length of the thin film transistors in the second switch device; and
a total channel width of the thin film transistors in the first switch device is less than the a total channel width of the thin film transistors in the second switch device.

4. The display panel according to claim 3, wherein the total channel width of the thin film transistors in the first switch device is less than the total channel width of the thin film transistors in the second switch device by 10% or less.

5. The display panel according to claim 4, wherein a quantity of the thin film transistors included in the first switch device is equal to a quantity of the thin film transistors included in the second switch device.

6. The display panel according to claim 3, wherein a quantity of the thin film transistors included in the first switch device is less than a quantity of the thin film transistors included in the second switch device.

7. The display panel according to claim 6, wherein the quantity of the thin film transistors included in the first switch device is less than the quantity of the thin film transistors included in the second switch device by 10% or less.

8. The display panel according to claim 1, wherein a quantity of the signal connection lines is less than a quantity of the data signal lines;
at least two switch devices, connected to different data signal lines, in the multiplex circuit are connected to a same signal connection line; and
the display panel further comprises a drive chip connected to the signal connection lines.

9. The display panel according to claim 8, wherein the pixel units are distributed in an array, the multiplex circuit is disposed in a non-display area on one side of a display area in a Mth direction, and the Mth direction is parallel to a row direction of the pixel unit;
the switch devices in the multiplex circuit are arranged in a row direction of the pixel unit;
the data signal lines and the signal connection lines extend in a column direction of the pixel unit, and are arranged in the row direction of the pixel unit; and
the thin film transistors in a same switch device are arranged in an extending direction of one of the data signal lines.

10. The display panel according to claim 9, wherein a the Nth direction, a first electrode and a second electrode of each of the thin film transistors are oppositely arranged on two sides of a gate of the thin film transistor; and
the first electrode of each of the thin film transistors is a source, and the second electrode of each of the thin film transistors is a drain; or, the first electrode of each of the thin film transistors is a drain, and the second electrode of each of the thin film transistors is a source; and the Nth direction is parallel to the row direction of the pixel unit.

11. The display panel according to claim 10, wherein a width, in the row direction of the pixel unit, of orthographic projections of gates of the thin film transistors in the first switch device on an active layer is equal to a width, in the row direction of the pixel unit, of orthographic projections of gates of the thin film transistors in the second switch device on the active layer; and a total length, in the column direction of the pixel unit, of orthographic projections of gates of the thin film transistors in the first switch device on an active layer is less than a total length, in the column direction of the pixel unit, of orthographic projections of gates of the thin film transistors in the second switch device on the active layer.

12. The display panel according to claim 11, wherein every two adjacent switch devices form one multiplexer, and at least one signal connection line is disposed between two multiplexers.

13. The display panel according to claim 11, wherein a first switch device and a second switch device that are connected to a same signal connection line form one multiplexer;

a channel area of each of the switch devices comprises a first part and a second part that extend in the column direction of the pixel unit, wherein a length of the first part in the column direction of the pixel unit is greater than a length of the second part in the column direction of the pixel unit, and two second parts in a same multiplexer are not overlapped in the row direction of the pixel unit;

a length, in the column direction of the pixel unit, of the second part of the first switch device is less than a length, in the column direction of the pixel unit, of the second part of the second switch device; and two second parts in a multiplexer are positioned between two first parts in the multiplexer, the first part of the first switch device and the second part of the first switch device correspond to one and same first electrode, the first part of the second switch device and the second part of the second switch device correspond to one and same second electrode, and the second part of the first switch device and the second part of the second switch device correspond to one and same first electrode.

14. The display panel according to claim 13, further comprises first signal lines extending in the row direction of the pixel unit, and the first signal lines are positioned between adjacent multiplexers.

15. The display panel according to claim 11, wherein sides, connected to one of the signal connection lines, of the switch devices are aligned with each other, and a notch is formed in a position corresponding to the second switch device in sides, far away from the one of the signal connection lines, of the switch devices.

16. The display panel according to claim 15, further comprises second signal lines that extend in the row direction of the pixel unit and are positioned in a side, far away from the drive chip, of the multiplex circuit; and each of the second signal lines comprises a first extended area in a position corresponding to the notch, wherein the first extended area is embedded in the notch.

17. The display panel according to claim 15, wherein switch devices connected to a same signal connection line form one multiplexer;

the display panel further comprises third signal lines extending in the column direction of the pixel unit; and each of the third signal lines comprises a second extended area at a position corresponding to the notch, wherein the second extended area is embedded in the notch;

wherein the third signal lines are connected to a constant potential.

18. The display panel according to claim 9, wherein the pixel units comprise red pixel units, green pixel units and blue pixel units; and each first pixel unit column comprises the green pixel units, and each of the second pixel unit column comprises the red pixel units and the blue pixel units that are alternately arranged in the column direction of the pixel unit.

19. The display panel according to claim 18, wherein two adjacent first pixel unit columns are spaced by two second pixel unit columns, and colors of two pixel units that are adjacent to each other in a row direction and are in two adjacent second pixel unit columns are different;

wherein two switch devices corresponding to two adjacent pixel unit columns are connected to different data signal lines and a same signal connection line.

20. A display apparatus, comprising:

a display panel, wherein the display panel comprises a multiplex circuit, a plurality of signal connection lines and a plurality of data signal lines, wherein the multiplex circuit comprises a plurality of input ends and a plurality of output ends, the plurality of input ends of the multiplex circuit are connected to signal connection lines, and the plurality of output ends of the multiplex circuit are connected to data signal lines;

the multiplex circuit comprises a plurality of switch devices, each of the switch devices comprises at least one thin film transistor, and each of the switch devices is electrically connected to a pixel unit column by a corresponding data signal line;

the switch devices comprise a first switch device and a second switch device;

the pixel unit column comprise a first pixel unit column and a second pixel unit column, colors of pixel units in the first pixel unit column are same, and colors of at least two pixel units in the second pixel unit column are different;

the first switch device is in one-to-one correspondence to the first pixel unit column, and the second switch device is in one-to-one correspondence to the second pixel unit column; and an equivalent channel width-to-length ratio of thin film transistors in the first switch device is less than an equivalent channel width-to-length ratio of thin film transistors in the second switch device, and the equivalent channel width-to-length ratio is a ratio of a total channel width of thin film transistors in switch devices to a total channel length of the thin film transistors in the switch devices.

* * * * *